United States Patent
Fink

(10) Patent No.: US 7,311,784 B2
(45) Date of Patent: *Dec. 25, 2007

(54) PLASMA PROCESSING DEVICE

(75) Inventor: Steven T. Fink, Mesa, AZ (US)

(73) Assignee: Tokyo Electron Limited, Tokyo (JP)

( * ) Notice: Subject to any disclaimer, the term of this patent is extended or adjusted under 35 U.S.C. 154(b) by 297 days.

This patent is subject to a terminal disclaimer.

(21) Appl. No.: 10/720,189

(22) Filed: Nov. 25, 2003

(65) Prior Publication Data

US 2004/0149389 A1 Aug. 5, 2004

Related U.S. Application Data

(60) Provisional application No. 60/428,924, filed on Nov. 26, 2002.

(51) Int. Cl.
*H01L 21/00* (2006.01)

(52) U.S. Cl. ............... 118/728; 156/345.51; 118/723 E

(58) Field of Classification Search ................ 118/728; 156/345.51

See application file for complete search history.

(56) References Cited

U.S. PATENT DOCUMENTS

| | | | |
|---|---|---|---|
| 5,660,673 A * | 8/1997 | Miyoshi ................ | 156/345.51 |
| 5,677,824 A * | 10/1997 | Harashima et al. ......... | 361/234 |
| 6,210,593 B1 * | 4/2001 | Ohkuni et al. ................ | 216/59 |
| 6,261,408 B1 * | 7/2001 | Schneider et al. ..... | 156/345.26 |
| 6,676,759 B1 * | 1/2004 | Takagi ........................ | 118/728 |
| 6,709,547 B1 * | 3/2004 | Ni et al. ................. | 156/345.51 |
| 6,797,068 B1 * | 9/2004 | Yamasaki et al. ........... | 118/728 |
| 6,935,466 B2 * | 8/2005 | Lubomirsky et al. ....... | 187/250 |
| 2002/0072240 A1 * | 6/2002 | Koike ........................ | 438/710 |

FOREIGN PATENT DOCUMENTS

| | | | |
|---|---|---|---|
| JP | 05140771 A | * | 6/1993 |
| JP | 2000049100 A | * | 2/2000 |
| JP | 2001148415 A | * | 5/2001 |
| JP | 2001230239 A | * | 8/2001 |

* cited by examiner

*Primary Examiner*—Parviz Hassanzadeh
*Assistant Examiner*—Michelle Crowell
(74) *Attorney, Agent, or Firm*—Oblon, Spivak, McClelland, Maier & Neustadt, P.C.

(57) ABSTRACT

This invention relates to a plasma processing system. A common problem in the manufacture of semiconductors is the maintenance of a constant fluid flow throughout the chamber in which the semiconductors are being etched. The focus ring described herein helps control fluid flow such that all (or substantially all) of a substrate (e.g., semiconductor) surface is exposed to a constant flow of plasma throughout the etching process. An even fluid flow is maintained by adjusting the configuration of a focus ring, a pumping baffle, or a focus ring working with an auxiliary focus ring with respect to the semiconductor surface. By manipulating the position of the focus ring, pumping baffle, and auxiliary focus ring, fluid flow over the surface of the semiconductor can be increased, decreased, or kept stagnant.

18 Claims, 10 Drawing Sheets

PLASMA PROCESSING DEVICE

CROSS-REFERENCE TO RELATED APPLICATIONS

This application is related to and claims priority to U.S. Provisional Application Ser. No. 60/428,924, filed Nov. 26, 2002. The entire contents of this application are incorporated herein by reference.

BACKGROUND OF THE INVENTION

1. Field of the Invention

The present invention generally relates to the processing of substrate (e.g., semiconductor) surfaces, and in particular, relates to providing a more uniform gas flow within a process chamber during the processing (e.g., etching) of substrate surfaces.

2. Discussion of the Background

As is known in the art, a fundamental step in the manufacture of semiconductor devices, such as integrated circuits (ICs), is the process of forming electrical interconnections. The formation of electrical circuits, such as semiconductor transistors, involves a series of steps starting with the formation of a blank silicon wafer. The blank silicon wafer is then processed using successive steps of depositing to and etching away various materials to form the transistor devices and the proper interconnections, and therefore the electrical circuits.

One method of depositing and etching metal layers to and from a silicon wafer includes the use of a plasma reactor system. In semiconductor manufacturing, plasma reactor systems are used to remove material from or deposit material to a work-piece (e.g., semiconductor wafer) in the process of making integrated circuit (IC) devices. A key factor in obtaining the highest yield and overall quality of ICs is the uniformity of the etching and deposition processes.

In a narrow gap, high aspect ratio capacitively coupled plasma reactor, a multipurpose chuck assembly design is often employed that attempts to allow the chuck assembly (i.e. wafer work piece holder) to serve additional purposes other than supporting the wafer. The complexity of the mechanical design of the chuck assembly is such that a non-optimal vacuum system design is often used. A vacuum pumping system is used to evacuate the reactor processing region to the low pressure necessary to create a clean environment, to which a specific gas chemistry is introduced, which provides an environment for the generation of plasma. Consequently, due to the complexity of the chuck assembly mechanical design, the symmetry of the vacuum system (relative to the wafer) is sacrificed such that the vacuum pump is usually positioned to access the reactor vacuum chamber from the side rather than from the chamber bottom or top.

This type of multi-purpose chuck assembly can become a very cumbersome component of the reactor. In a multipurpose chuck assembly design, in addition to supporting the wafer, the chuck assembly is typically configured to provide vertical translation in order to control the electrode-to-wafer spacing. This spacing control is necessary in order to produce a narrow gap for process conditions and to enlarge the gap for wafer exchange. In addition to the aforementioned capabilities, the chuck must be capable of sustaining a radio frequency (RF) energy bias. Moreover, the chuck assembly design further includes components for chuck block cooling, electrostatic clamping and backside gas flow to improve thermal conduction (between the wafer and the chuck). Consequently, the vacuum design is often a secondary consideration to other various mechanical and electrical component designs.

A reactor chamber that is equipped with a side mount vacuum port is considered an asymmetrical design in a nominally cylindrical system. An inherent drawback associated with an asymmetric design is that it often times produces an asymmetric process. One such asymmetry stemming from an asymmetric vacuum design is the observation of pressure field non-uniformity above the wafer when the chamber is evacuated from the side. That is, a pressure gradient with about 10-20% variation can occur across the wafer being processed. In general, for moderate to high pressures (e.g. P>20 mTorr), a region of low pressure is observed at an azimuthal location adjacent the pump entrance or pumping duct entrance (the pumping duct interfaces the inlet of the pump, e.g. turbo-molecular pump, with the vacuum chamber). In known capacitively coupled plasma reactors, attempts to solve the problem of an asymmetric chamber flow field introduced by pumping from the side have included the insertion of an orifice plate adjacent to the chuck. The orifice plate has holes located therein which are usually uniformly located around the plate. However, an orifice plate restricts the flow-rate through the chamber, thereby reducing process times.

The process chamber is typically cylindrical, and the unetched surface is placed in a process chamber such that the plane of the etching surface is generally perpendicular to the axis of the chamber. A processing chamber generally includes a single evacuated volume wherein a portion of that volume is proximate the wafer and is hereinafter referred to as the processing region. When an orifice plate is employed, the chamber volume is separated into two regions by the orifice plate. The first region is predominantly occupied by the wafer processing region and the second region, referred to as the pumping volume, is accessed by the vacuum pump. This solution tends to improve the flow-field uniformity in the upper chamber volume by providing sufficient flow resistance through the orifice plate. However, this improvement is achieved at the expense of flow conductance or pumping speed at the processing region. In addition to placing the orifice plate or pumping baffle adjacent the chuck assembly, other prior art designs included locating the orifice plate adjacent other surfaces, e.g. any surface interfacing the processing chamber volume that allows the exhaust of chamber gases.

However, problems exist with known methods of controlling pressure uniformity in a chamber. For example, known orifice plates or pumping baffles typically distribute the small openings equally in the azimuthal direction about the orifice plate or pumping baffle in the hope that the resultant flow conductance will be azimuthally symmetric through the plate. However, in order to achieve flow-field uniformity, it is necessary to restrict the flow through the orifice plate to the extent that the pressure difference across the orifice plate or pumping baffle is significantly greater than any pressure gradient in the processing or pumping regions. This requires making the holes in the orifice plate small and, hence, paying a penalty in chamber pumping speed at the wafer. This penalty in pumping speed directly results in an adverse effect on throughput.

In addition to the problem of pressure field non-uniformity described above, an additional problem associated with plasma processing systems is the transport of plasma to the pumping duct and pump inlet. In general, the aforementioned orifice plate, pumping baffle, or a separate pumping duct screen is utilized to attenuate the plasma density prior to reaching the pump inlet. For example, in typical known systems a pump screen (with generally less than 50% solidity) is placed in the cross-section of the pumping duct. Unfortunately the pumping screen attenuates the plasma and also reduces the pumping speed delivered to the processing region by at least a factor of two. This approach results in at least 50% of the frontal area of the pumping duct cross-section being utilized for recombination surfaces. In conventional designs, there is a one-to-one relationship between the increase in recombination surface area and the decrease in the frontal (flow-through) area.

Other attempts have been made to direct fluid flow within the chamber in a uniform manner; baffles have been introduced in the process chamber in an attempt to provide direction for fluid flow therein. Attempts have been made to uniformly inject plasma from above the substrate surface directly thereon, while disregarding the effect of the side vacuum port.

SUMMARY OF THE INVENTION

These and other problems are addressed by the present invention which provides a fluid flow control member for controlling gas or fluid flow in a plasma processing system.

In one embodiment of the present invention, a focus ring helps control gas flow (also referred to as fluid flow) such that all (or substantially all) of a substrate (e.g., semiconductor) surface is exposed to a constant flow of plasma throughout the etching process while simultaneously increasing the flow of plasma in the chamber.

In a second embodiment of the present invention, a pumping baffle helps control the fluid flow such that the flow is uniform across a substrate surface.

In a third embodiment of the present invention, an auxiliary focus ring is described as in the first embodiment such that fluid flow can be more accurately maintained.

An even fluid flow is maintained by adjusting the configuration of a fluid flow control member (e.g., focus ring, a pumping baffle, or an auxiliary focus ring) with respect to the substrate surface. By manipulating the position of the fluid flow control member, fluid flow over the surface of the semiconductor can be increased, decreased, or kept stagnant. A secondary effect of manipulating the fluid flow is the manipulation of the pressure gradient across the substrate surface.

BRIEF DESCRIPTION OF THE DRAWINGS

The above-noted and other aspects of the present invention will become more apparent from a detailed description of preferred embodiments when read in conjunction with the drawings, wherein.

DETAILED DESCRIPTION OF THE PREFERRED EMBODIMENTS

Figure 1:
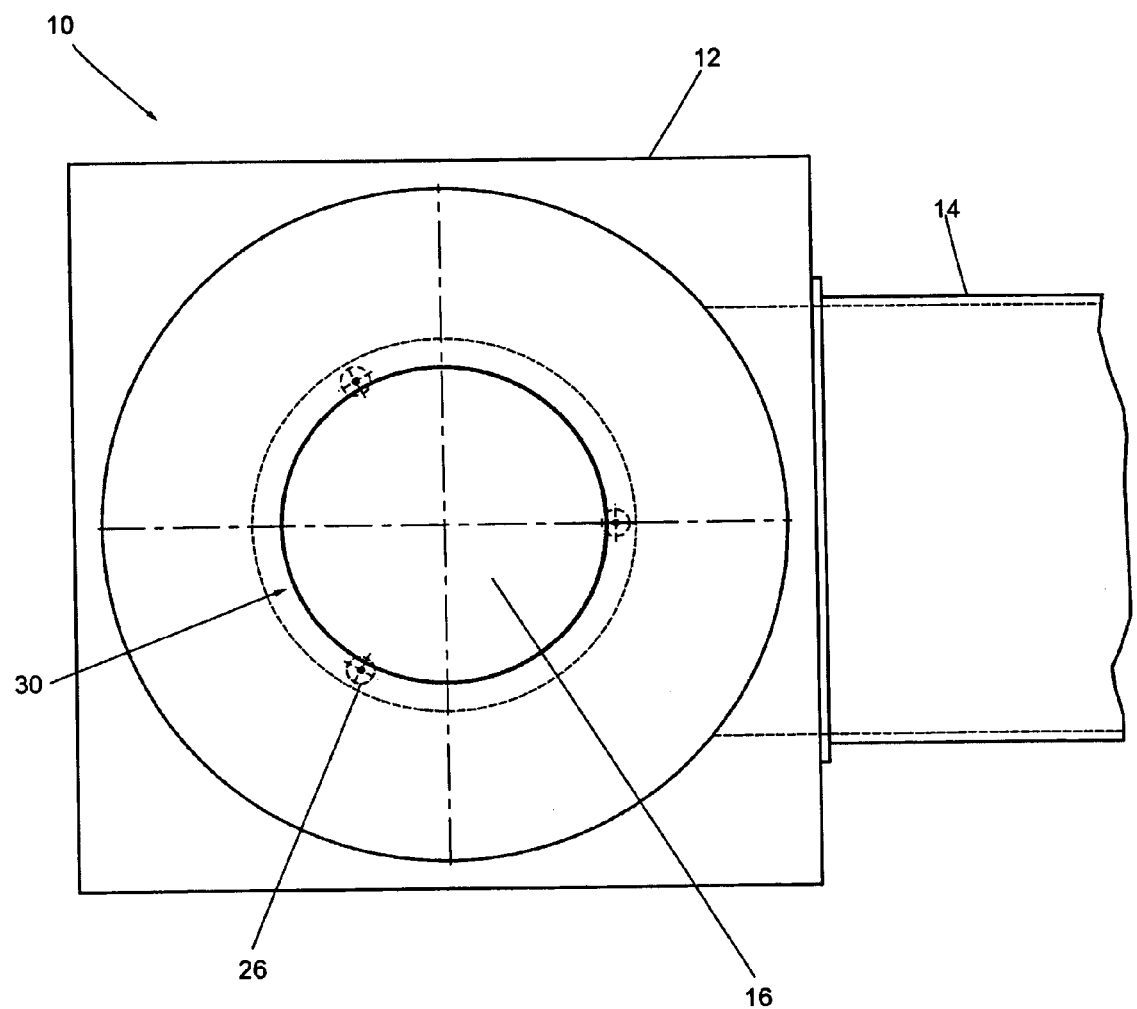
FIG. 1 is a plan view of a process chamber (without a pumping baffle) utilizing a movable focus ring according to the present invention.
Figure 2A:
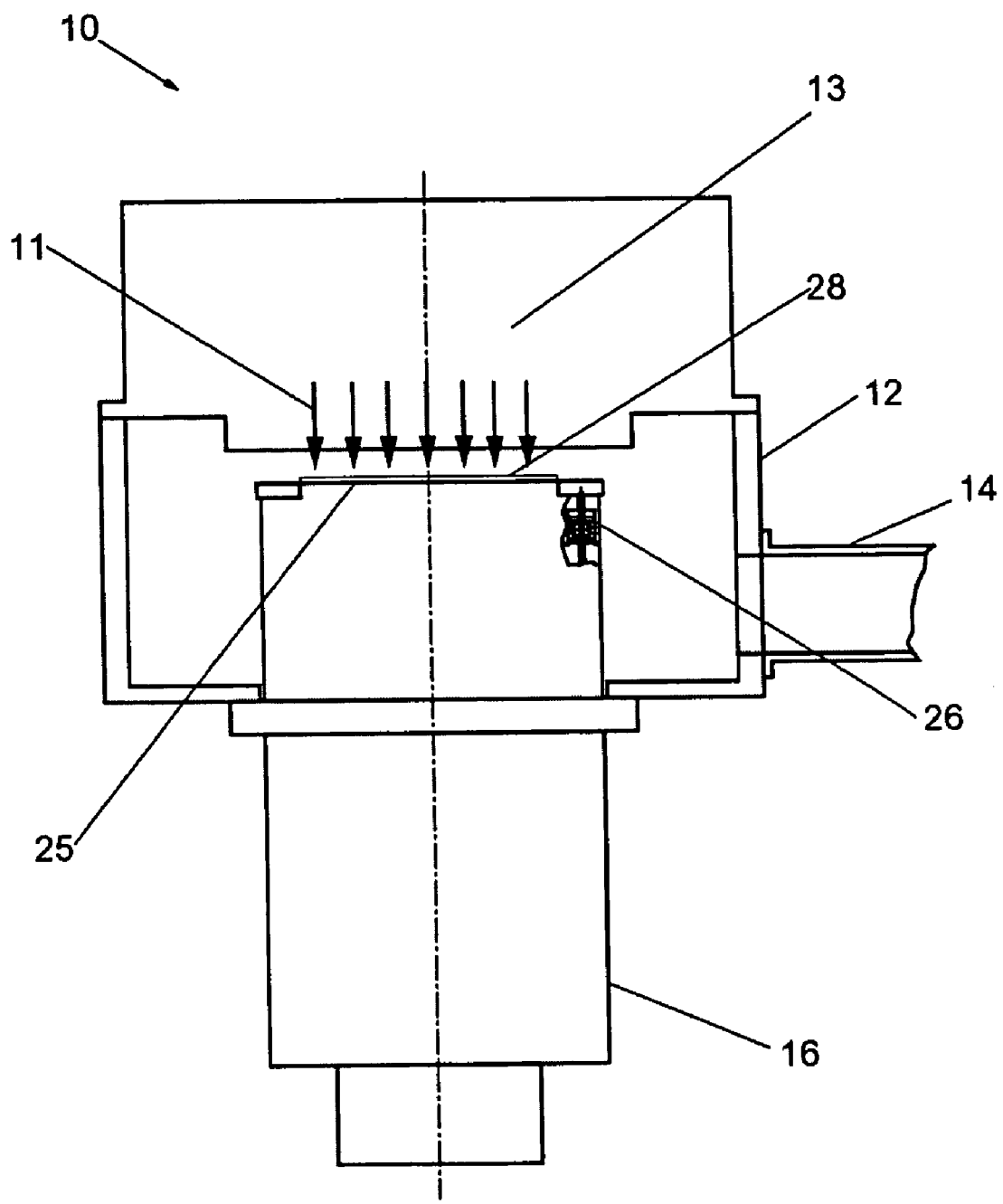
FIG. 2A is a cross-sectional view of the process chamber of FIG. 1 where the focus ring is in a lowered position.
Figure 2B:
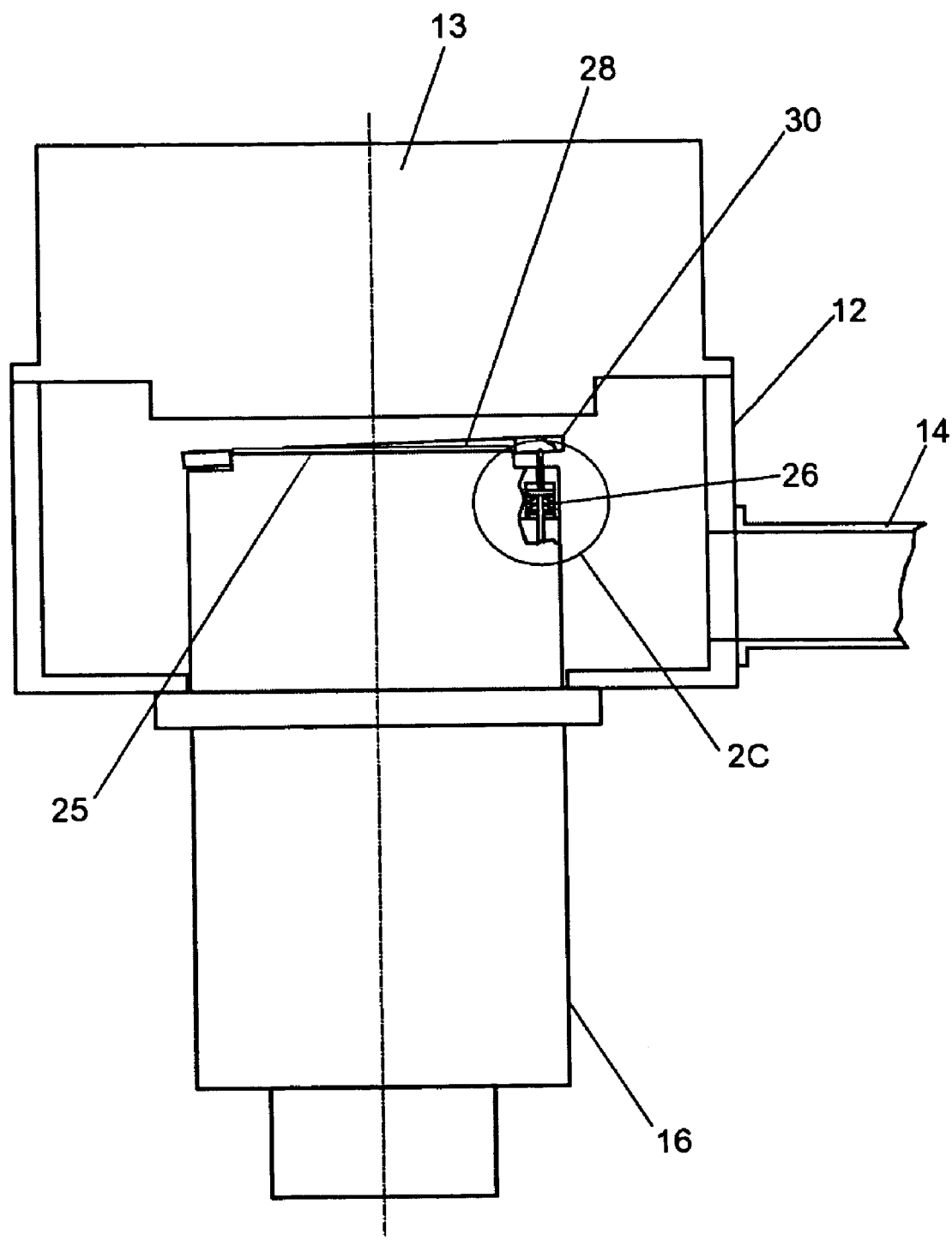
FIG. 2B is a cross-sectional view of the process chamber of FIG. 1 where the focus ring is in a raised, tilted position.

FIGS. 1, 2A and 2B show an embodiment of a plasma processing device 10. A vacuum pump (not shown) reduces the pressure within a process chamber 12. The vacuum pump is connected to the process chamber by a vacuum port 14, which can be located anywhere around the process chamber 12 such that a sufficient vacuum can be created within the process chamber 12 by the vacuum pump. After a sufficiently low pressure is established, at least one process gas enters a process chamber 12 through gas inlet ports (not shown) in an upper electrode assembly 13.

In the manufacture of semiconductor devices, the wafer chuck assembly/lower electrode 16 can, for example, be vertically translatable. For instance, it can be lowered below a substrate transfer plane (not shown) during substrate load and unload. Alternatively, the wafer chuck assembly/lower electrode 16 can be raised to a process plane (not shown) dictated by the process recipe. The wafer chuck assembly/lower electrode 16 acts as a cathode in opposition to the upper electrode assembly 13 which acts as an anode. When energized by the power source, the system charges the reactant gas such that plasma is created. The plasma then acts to etch the substrate 28 sitting on the substrate platform 25. As discussed in greater detail below, fluid flow control members (e.g., focus ring 30, pumping plenum 40, and auxiliary focus ring 50) help to direct flow of reactant gas 11 toward the substrate platform 25 in such a way that pressure is uniform along the surface of the subject platform.

Figure 2C:
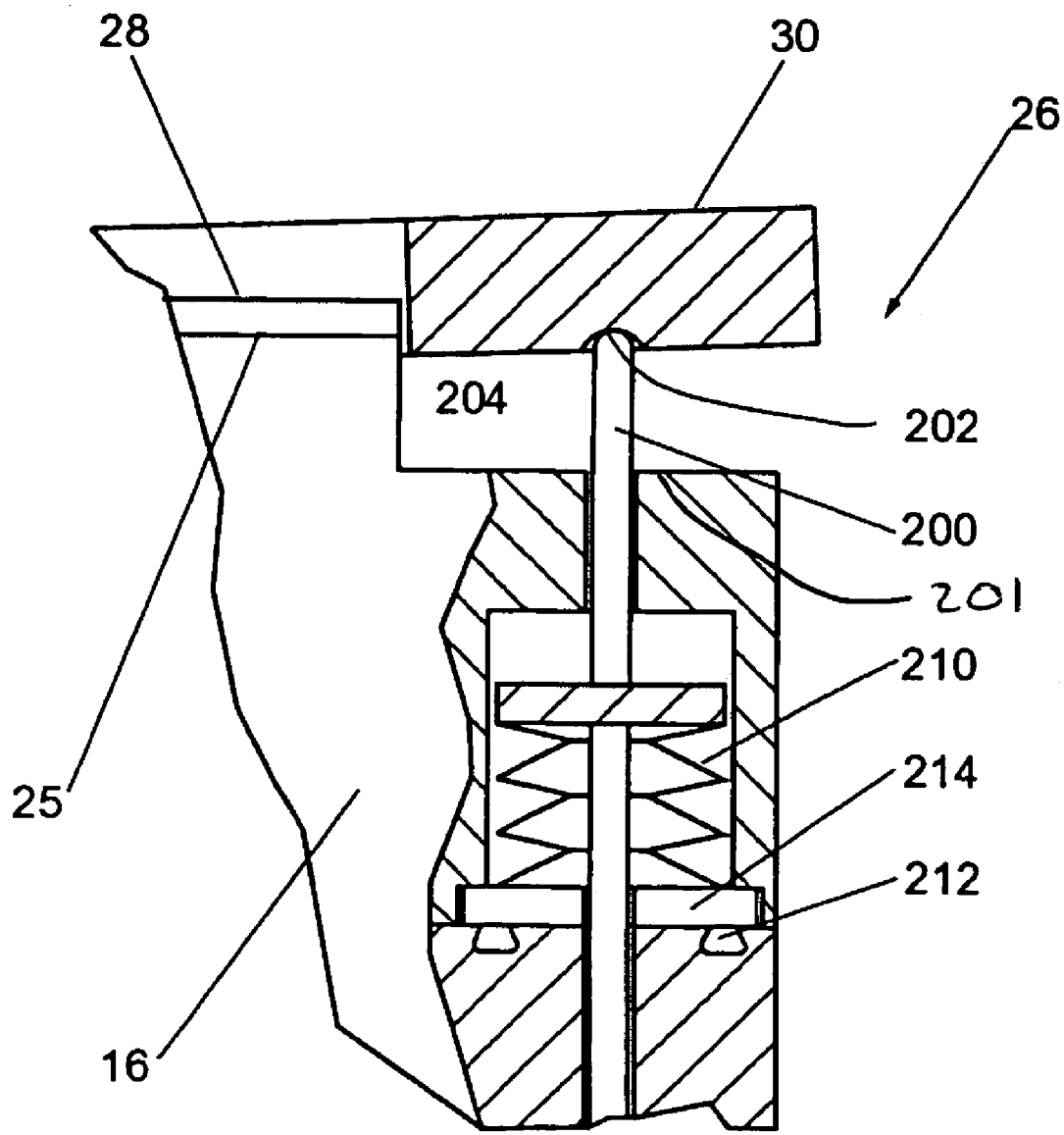
FIG. 2C is a cross-sectional detail view of a lift pin assembly.

A focus ring 30 is located around the substrate platform 25. The focus ring 30 can be raised and lowered by lift pins of a lift pin assembly 26. FIG. 2C presents a cross-sectional detail view of the lift pin assembly 26. Lift pin assembly 26 comprises a lift pin 200 having a tip 202, wherein tip 202 can be received by a recess 204 formed within a bottom surface of focus ring 20. The tip 202 and recess 204 can, for example, be round (i.e. convex and concave), conical, etc. Lift pin assembly 26 can further comprise a bellows 210, a seal 212, and a sealing plate 214 for mechnically compressing seal 212, as illustrated in FIG. 2C. The lift pin assembly can be moved by motion actuator hardware (not shown). In its lowered position, the tip 202 can either be below the surface 201 or slightly above the surface 201. One advantage to having the tip 202 slightly above the surface 201 in its lowered position is that one will feel when the tip 202 becomes aligned with the recess 204 during installation of the focus ring 20.

At its lowered position, the bottom of the focus ring 30 can sit flush with the top surface of the substrate platform 25. However, the focus ring 30 can be raised by lift pin assemblies 26 such that the relationship of the surface of the substrate 28 with the top surface of at least a portion of the focus ring 30 is altered. The effect of this is to create a decreased fluid flow immediately above at least a portion of the substrate platform 25.

The focus ring 30 can also be tilted such that the flow is directed in a particular direction across the subject platform 25. For example, raising a first lift pin of a first lift pin assembly 26 while keeping the other lift pins lowered impedes the fluid in the direction of the raised side. As is shown in FIG. 2B, lifting the lift pin of lift pin assembly 26 tilts the focus ring 30 causing the flow of the plasma to be impeded on the lifted side of the focus ring 30. The need for an alteration in fluid flow is determined by using a plurality of manometers within the plasma processing system 10. When the manometers detect a non-uniform flow or a flow that is outside a target range, the lift pins are actuated (either manually or automatically) to adjust the flow.

The pressure of the reactant gas changes as a secondary effect of the fluid flow direction being changed; therefore, the substrates 28 are subjected to a more uniform pressure gradient across their surfaces even when fluid flow is increased.

Figure 3A:
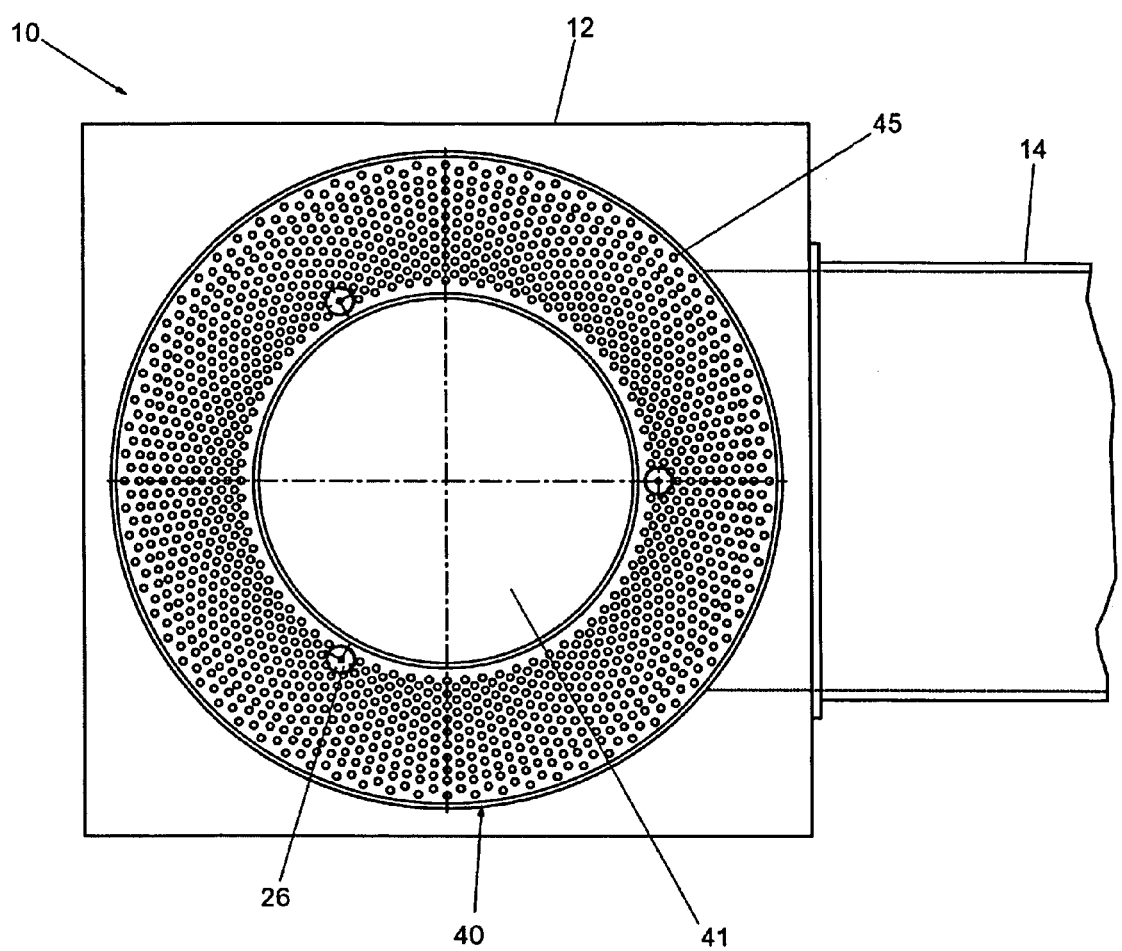
FIG. 3A is a plan view of a process chamber utilizing a movable pumping baffle with uniform hole distribution according to the present invention.
Figure 3B:
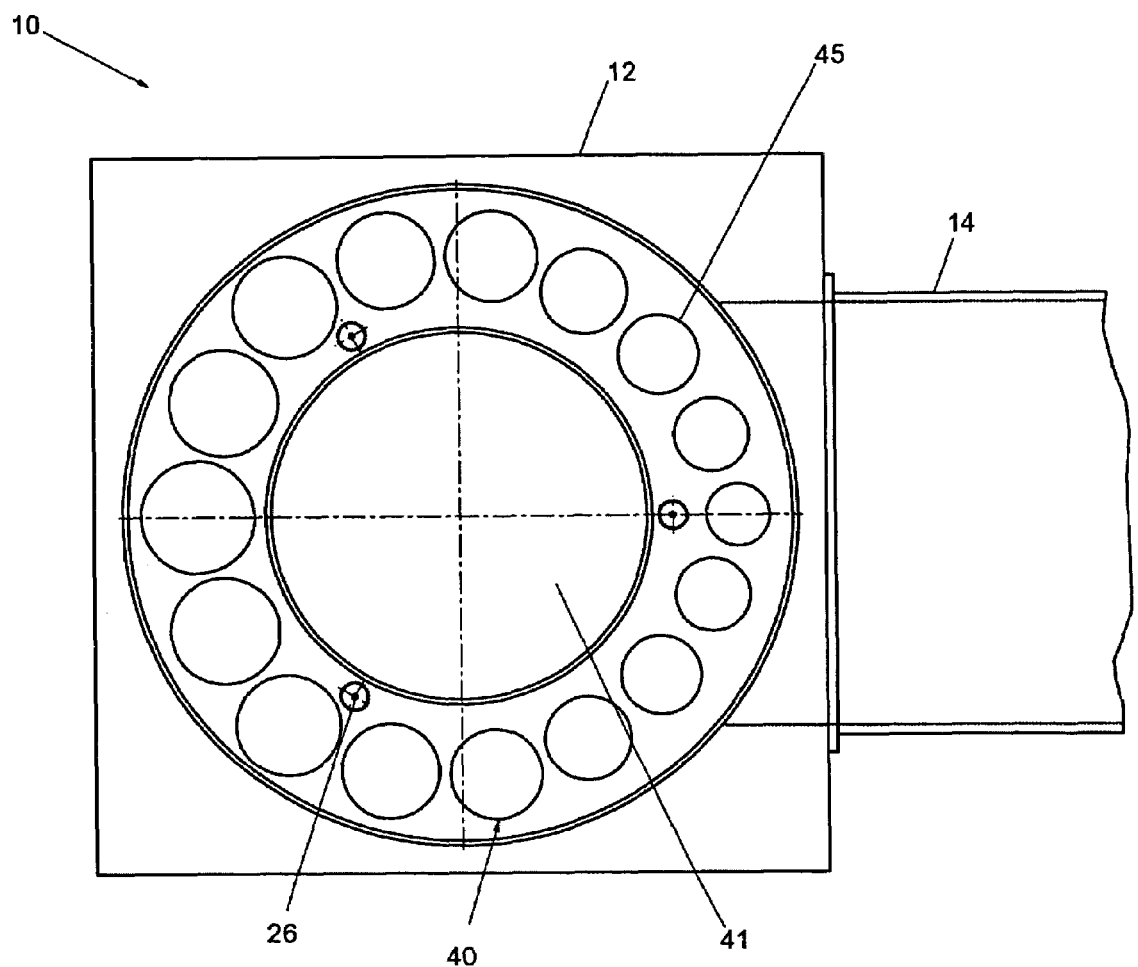
FIG. 3B is a plan view of a process chamber utilizing a movable pumping baffle with non-uniform hole distribution according to the present invention.
Figure 3C:
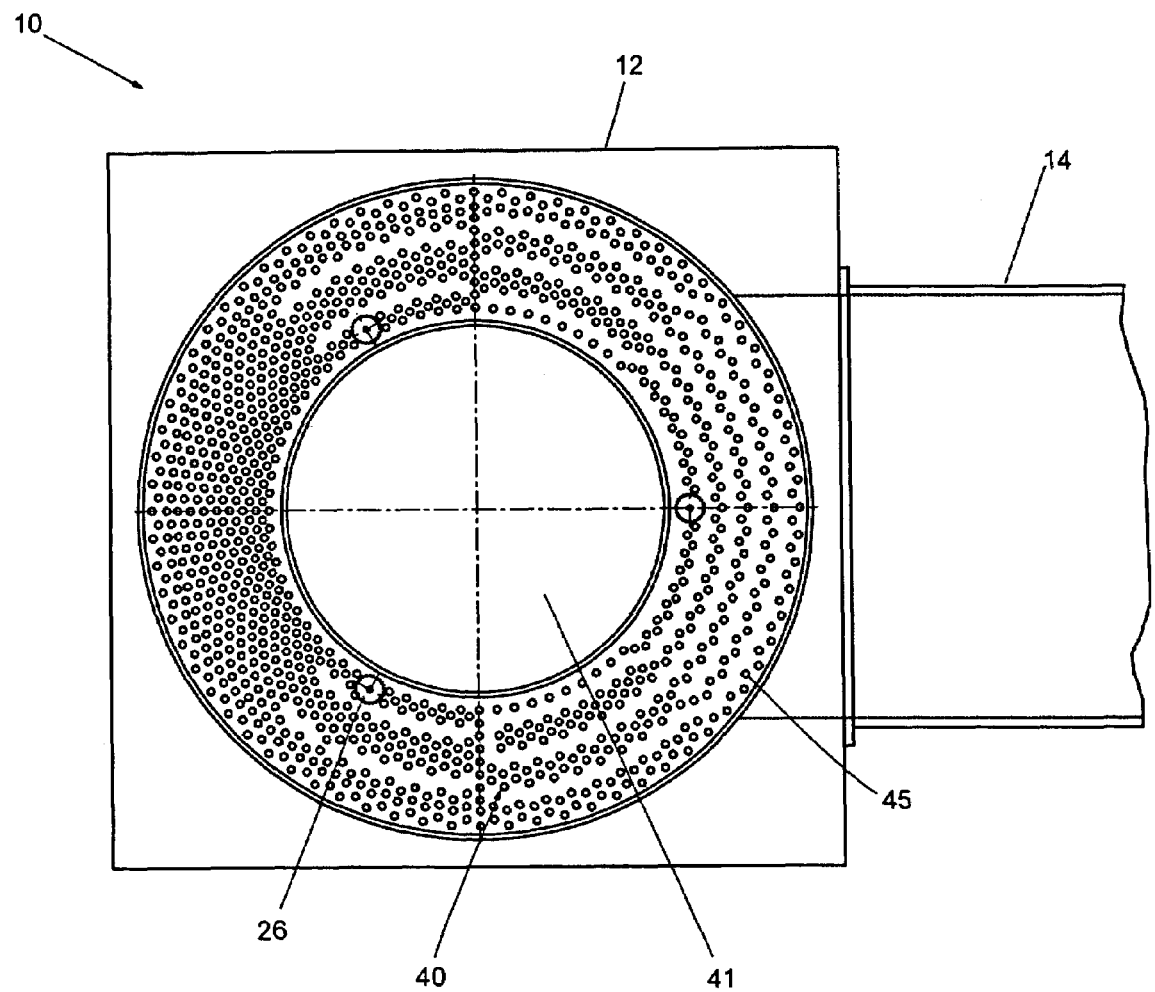
FIG. 3C is a plan view of a process chamber utilizing another movable pumping baffle with non-uniform hole distribution according to the present invention.
Figure 4:
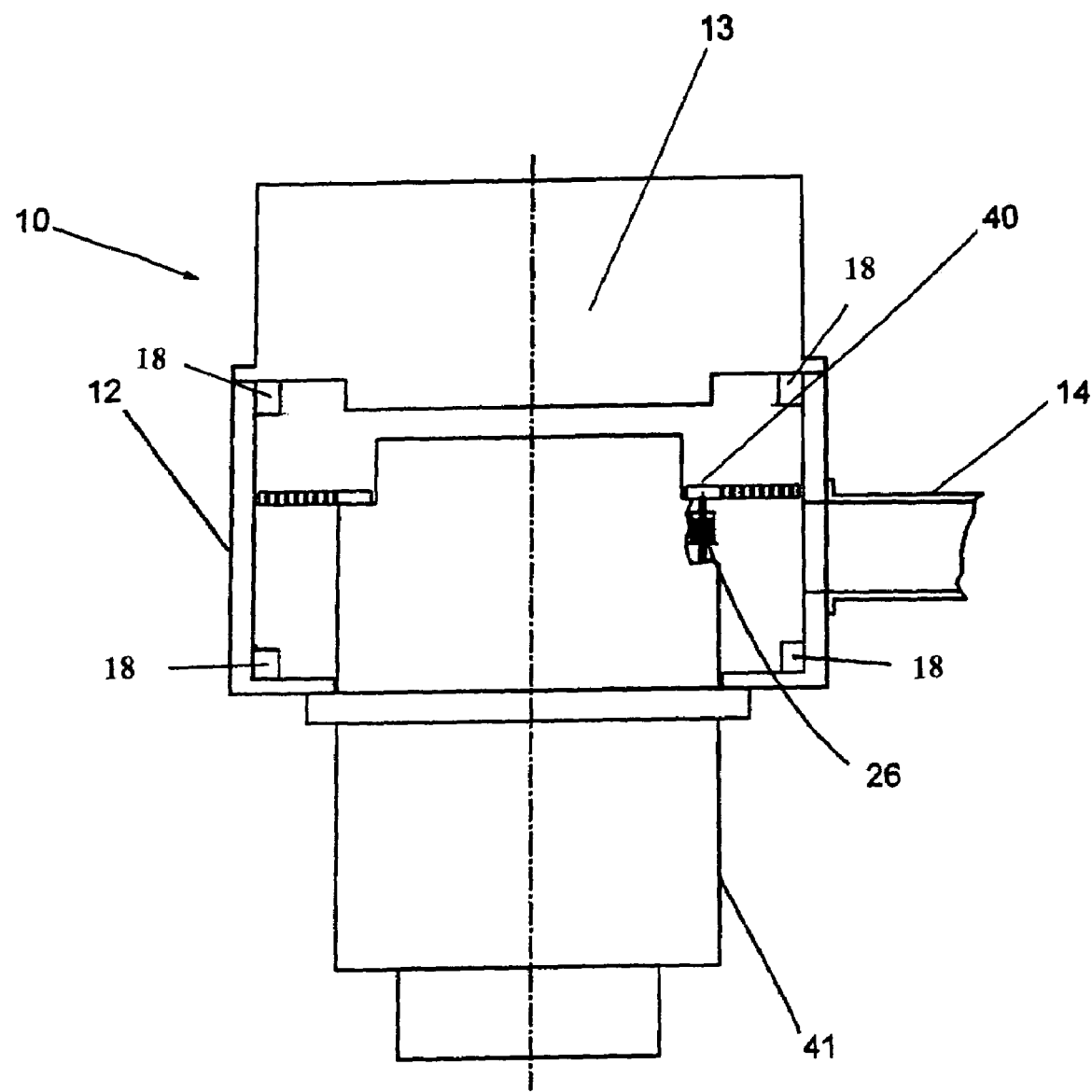
FIG. 4 is a cross-sectional view of the process chamber of FIGS. 3A-C.

As is shown in FIGS. 3A-C, and 4, another embodiment of the plasma processing device 10 includes a wafer chuck assembly 41 in communication with a pumping baffle 40. Within the pumping baffle 40 there is a plurality of holes 45 arranged in any number of patterns. The number of holes can be increased or decreased depending on the desired fluid flow rate and/or process rate. As illustrated in FIG. 3A, the number of holes can be uniformly distributed about the pumping baffle 40. Alternatively, the number of holes can be non-uniformly distributed either by size (FIG. 3B), or number density (FIG. 3C).

The pumping baffle 40 slides along the center line of the wafer chuck assembly lower electrode 41 in the axial direction through the force exerted by a plurality of lift pin assemblies 26. Each lift pin assembly 26 can act in unison thereby lifting the entire pumping baffle 40. Also, each lift pin assembly 26 can act individually, lifting only one side of the pumping baffle 40 at a time or lifting its respective section thereby causing a tilt in the pumping baffle 40. The adjusting of the pumping baffle 40 (i.e., changes in the tilt or elevation) causes changes in the fluid flow and pressure within the process chamber and changes the flow of plasma within the chamber. The need for an alteration in fluid flow is determined by using a plurality of pressure manometers 18 within the plasma processing system 10 located, for example, about a periphery of the plasma processing device 10. When the pressure manometers 18 detect a non-uniform flow or a flow that is outside a target range, the lift pins are actuated to adjust the flow.

Figure 5:
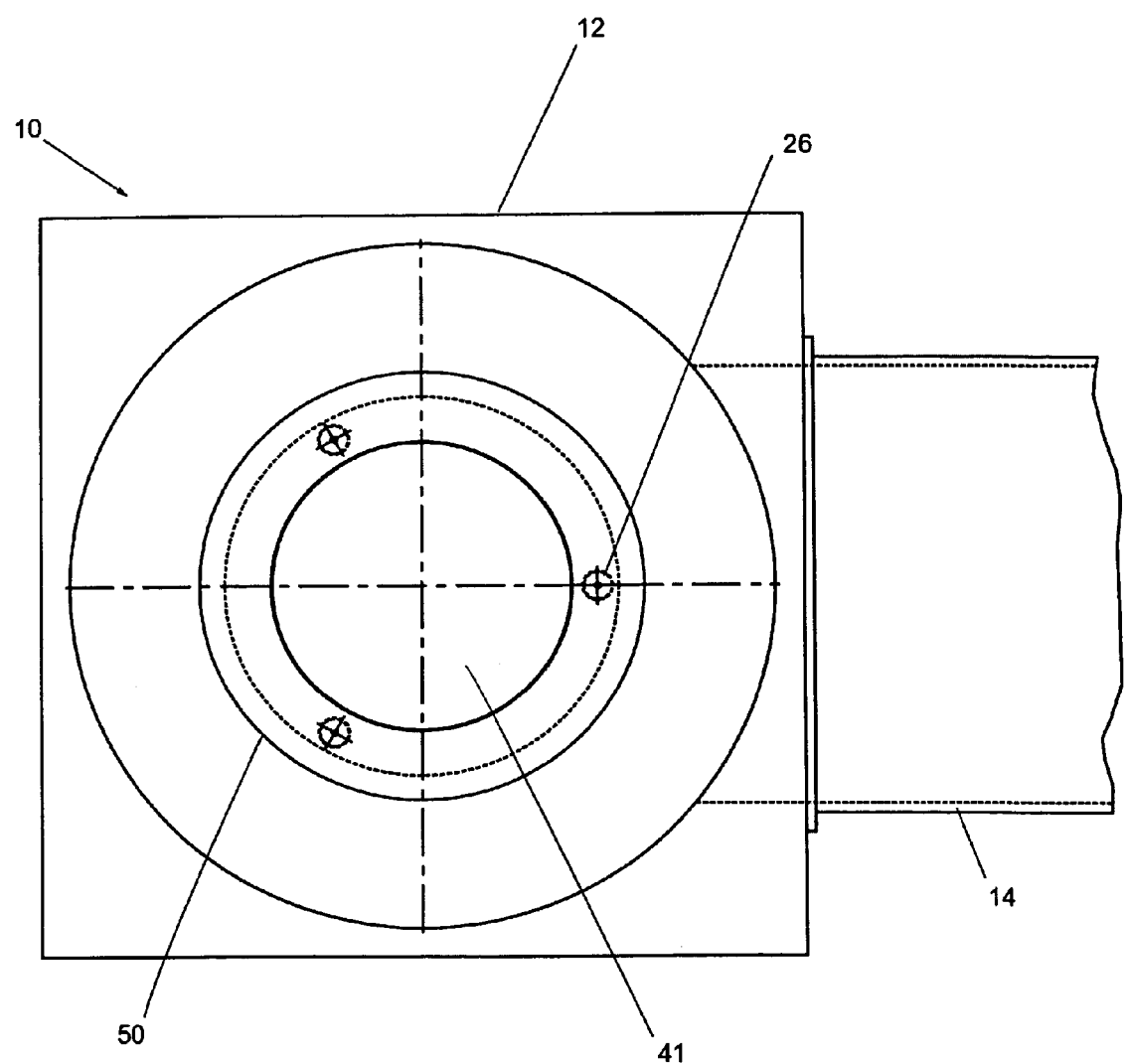
FIG. 5 is a plan view of a process chamber (without a pumping baffle) utilizing a movable auxiliary ring according to the present invention.
Figure 6:
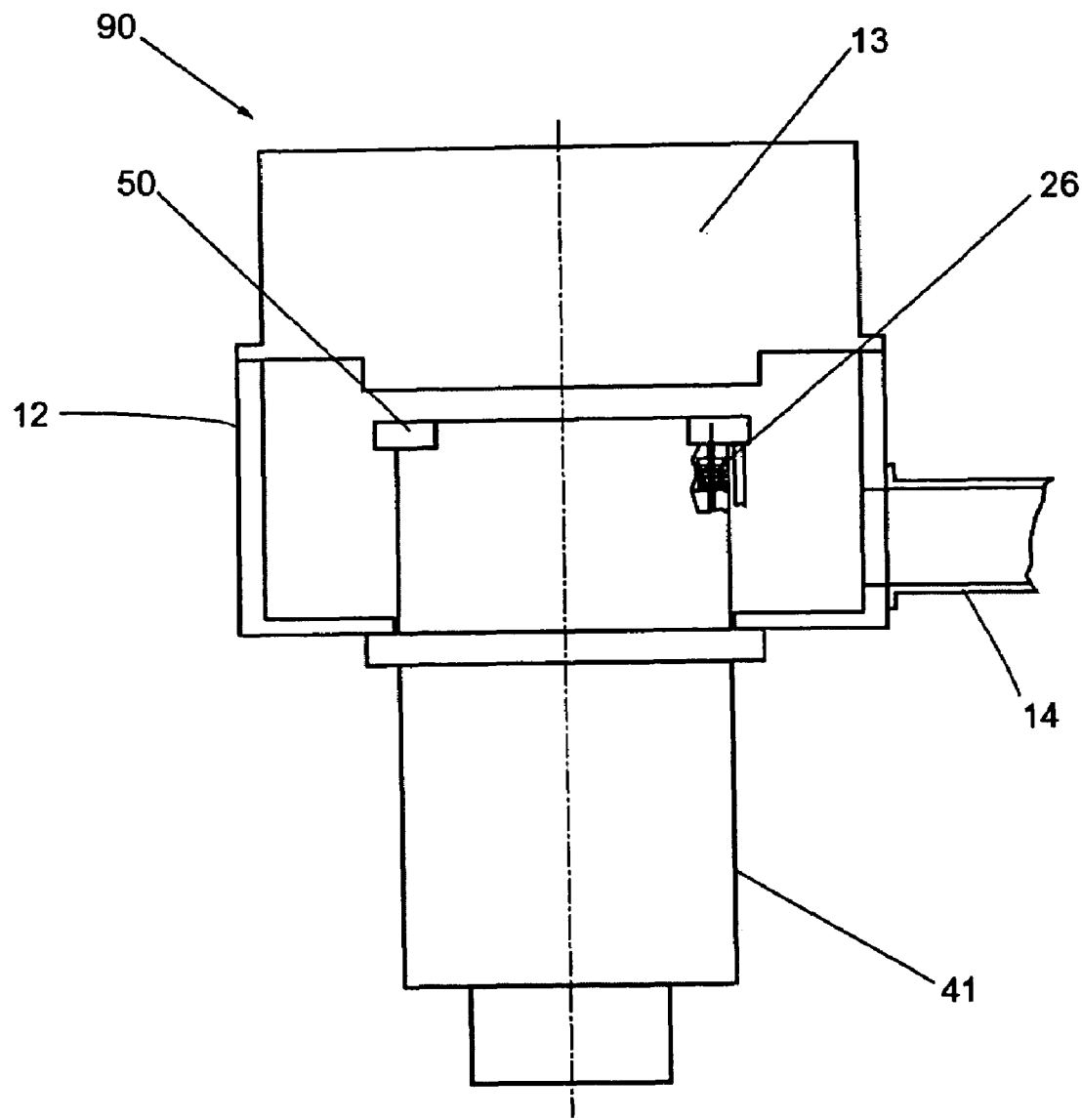
FIG. 6 is a cross-sectional view of the process chamber of FIG. 5.

Yet another embodiment of the plasma processing device 10 involves an auxiliary focus ring 50 as depicted in FIGS. 5 and 6. The auxiliary focus ring 50 allows more additional control of the pressure within the process chamber 12. In much the same way the focus ring 30 in the first embodiment controls the fluid flow and pressure in the process chamber 12, an auxiliary focus ring 50 (e.g., an auxiliary cooling focus ring) can provide more control than a single focus ring. Alternately, for example, auxiliary focus ring 50 can comprise a magnet assembly as described in greater detail in pending U.S. patent Ser. No. 60/291,927 (filed on Jun. 28, 2002), which is incorporated herein by reference in its entirety. Alternately, for example, auxiliary focus ring 50 can comprise an electrical bias assembly as described in greater detail in world publication Ser. No. US01/28318 (published on Sep. 12, 2001), which is incorporated herein by reference in its entirety.

While the fluid flow control members (e.g., focus ring 30 and pumping baffle 40) are not limited to any particular material, preferably they are formed of metal, ceramic or quartz and are temperature controlled. Moreover, the fluid flow control members may further include static magnetic and dynamic magnetic assemblies. Further, the pumping baffle 40 can be comprised of any dielectric material.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

The invention claimed is:

1. A plasma processing system comprising:
a process chamber;
an upper electrode assembly;
a plurality of pressure detectors configured to detect pressures in a plurality of locations in the process chamber;
a chuck assembly including a support surface configured to support a wafer; and
a fluid flow control member including a plurality of recesses, said fluid flow control member located on the chuck assembly and surrounding the support surface of the chuck assembly, the fluid flow control member having an upper surface substantially in a same plane as the support surface of the chuck assembly when the fluid flow control member is in a withdrawn position,
wherein the chuck assembly includes a plurality of lift pin assemblies for lifting the fluid flow control member at at least one location, each lift pin assembly including a lift pin configured to engage with a respective recess of the fluid flow control member to directly lift the fluid flow control member to an extended position such that the upper surface of the fluid flow control member extends above the support surface of the chuck assembly, the lift pins configured to be controlled based on the pressures detected by the plurality of pressure detectors.

2. The plasma processing system of claim 1 wherein the chuck assembly comprises at least one of an RF electrode and an electrostatic clamping electrode.

3. The plasma processing system of claim 1 wherein the fluid flow control member comprises a focus ring.

4. The plasma processing system of claim 1 wherein the fluid flow control member comprises a pumping baffle.

5. The plasma processing system of claim 1 wherein the fluid flow control member comprises an auxiliary focus ring.

6. The plasma processing system of claim 1 wherein lift pins of each of the plurality of lift pin assemblies are lifted simultaneously.

7. The plasma processing system of claim 1 wherein lift pins of each of the plurality of lift pin assemblies are controllable to be lifted individually.

8. The plasma processing system of claim 1, further comprising a vacuum port located next to at least one of the plurality of lift pin assemblies.

9. The plasma processing system of claim 1, wherein the lift pin extends through a horizontal surface of the chuck assembly when the lift pin is fully retracted.

10. The plasma processing system of claim 9, wherein the lift pin engages the respective recesses of the fluid flow control member when the lift pin is fully retracted.

11. A plasma processing system comprising:

a process chamber;

an upper electrode assembly;

a plurality of pressure detectors configured to detect pressures in a plurality of locations in the process chamber;

a chuck assembly including a support surface configured to support a wafer; and a fluid flow control member including a plurality of recesses, said fluid flow control member located on the chuck assembly and surrounding the support surface of the chuck assembly, the fluid flow control member having an upper surface substantially in a same plane as the support surface of the chuck assembly when the fluid flow control member is in a withdrawn position; and wherein the chuck assembly includes a plurality of lifting means for lifting the fluid flow control member at at least one location, each lifting means engaging a respective recess of the fluid flow control member to directly lift the fluid flow control member to an extended position such that the upper surface of the fluid flow control member extends above the support surface of the chuck assembly, the lifting means being controlled based on the pressures detected by the plurality of pressure detectors.

12. The plasma processing system of claim 11, wherein the lifting means extends through a horizontal surface of the chuck assembly when the lifting means is fully retracted.

13. The plasma processing system of claim 12, wherein the lifting means engages the respective recesses of the fluid flow control member when the lifting means is fully retracted.

14. The plasma processing system of claim 11 wherein the fluid flow control member comprises a focus ring.

15. The plasma processing system of claim 11 wherein the fluid flow control member comprises a pumping baffle.

16. The plasma processing system of claim 11 wherein the fluid flow control member comprises an auxiliary focus ring.

17. The plasma processing system of claim 11 wherein the plurality of lifting means are lifted simultaneously.

18. The plasma processing system of claim 11 wherein the plurality of lifting means are controllable to be lifted individually.

* * * * *